United States Patent
Osmolovsky

(10) Patent No.: US 8,473,738 B2
(45) Date of Patent: Jun. 25, 2013

(54) MODE OF INFORMATION TRANSMISSION AND COMPLEX PROTECTION

(76) Inventor: Stanislav Antonovich Osmolovsky, Moscow (RU)

( * ) Notice: Subject to any disclaimer, the term of this patent is extended or adjusted under 35 U.S.C. 154(b) by 470 days.

(21) Appl. No.: 12/298,708

(22) PCT Filed: Oct. 22, 2007

(86) PCT No.: PCT/RU2007/000580
§ 371 (c)(1),
(2), (4) Date: Jun. 1, 2010

(87) PCT Pub. No.: WO2009/028982
PCT Pub. Date: Mar. 5, 2009

(65) Prior Publication Data
US 2010/0241859 A1 Sep. 23, 2010

(30) Foreign Application Priority Data
Aug. 30, 2007 (RU) ................................ 2007132646

(51) Int. Cl.
*H04L 29/06* (2006.01)
(52) U.S. Cl.
USPC ........... 713/160; 713/170; 709/225; 709/226; 709/232; 709/235; 380/28; 705/51
(58) Field of Classification Search
USPC ..... 713/170; 709/225–226, 232, 235; 380/28; 705/51; 715/150, 170
See application file for complete search history.

(56) References Cited

PUBLICATIONS

Not just for errors: Codes for fast and secure flash storage Cassuto, Y. GLOBECOM Workshops (GC Wkshps), 2010 IEEE (978-1-4244-8863-6) 2010. p. 1871-1875.*
Polar Codes for q-Ary Channels, Park, W.; Barg, A. Information Theory, IEEE Transactions on (0018-9448) 2013. vol. 59,Iss.2;p. 955-969.*
Maximum a posteriori estimation using ARCH models and burst error correcting array codes for burst-erasure recording channels Saito, H.; Kohno, R. Information Theory and its Applications (ISITA), 2010 International Symposium on (978-1-4244-6016-8);2010. p. 850-855; Source: IEEE Electronic Library Online.*

* cited by examiner

*Primary Examiner* — Taghi Arani
*Assistant Examiner* — Angela Holmes
(74) *Attorney, Agent, or Firm* — Daniel N. Smith

(57) ABSTRACT

The mode is intended for application in simplex and duplex channels of arbitrary including low, quality with implementation of tasks for complex protection of information.
The unified signal structure of stochastic q-ary (n, k, q, m)-code is used on the basis of any initial binary (n, k)-code with l-interleaving ($q=2^l$) with m-fold repetition of blocks of the code ($m=1, 2, \ldots, m_{max}$) with identical values of the data portion. Direct randomization of q-ary characters is performed on the transmitting side before transmission to the channel, on the receiving one—reverse randomization of q-ary characters. The code structure being applied represents ensemble of random codes varying for each block and q-ary character and ensuring transmission of any of all possible $2^n$ signals to a data link on binary sequence of length n as result of change in the strategy in the course of fight against random interferences.

15 Claims, No Drawings

MODE OF INFORMATION TRANSMISSION AND COMPLEX PROTECTION

The invention covers hardware that provides jam-resistant transmission capabilities to communication channels, networks and provides complex information protection of against all possible effects that may be performed on information during either the transmission and storage of said information and can also be applied to information systems, networks and data links of various types.

There are well-known methods of information transmission via data links utilizing the application of noise to combat cyclic codes with error detection as one of the data transmission channel (DTC) protocols, wherein the information transmitted is encoded with cyclic code, accepted information (in the form of blocks of a cyclic code or distorted blocks) is checked for any distortions, then said distorted blocks are re-transmitted via a feedback loop signal [1]. However, these methods do comprise the following flaws:

deterioration in the quality of the digital data link, wherein the transmissions become impossible when a large number of accepted blocks are found to be distorted and the DTC "runs into a cyclic path", the error detection method utilized by cyclic code does not provide an effective transmission rate that is relatively close to that of the data link capacity.

There are other well-known methods for information transmission that utilize algebraic error correction code (the Hamming method, the Bose-Chaudhuri-Hocquenghem method, the Reed-Solomon method, etc.) [2]. These methods have the following shortcomings:

algebraic based code used as methods of error-correction prove to be very sensitive to error multiplicity, which leads to a large and uncontrollable probability of decoding errors in grouped error channels that takes place in real data links;

encoding and especially decoding of known code is provided by rather difficult implementations, especially in software implementation.

In addition, there are well-known methods [2,3] of information encryption based on the application of cryptographic information transformation, and methods for the complex protection of information using cryptographic transformation and noiseless encoding, moreover, these methods combine several separate procedures of protection that are founded on various ways of information processing, for example, noise combating cyclic code with error detection, cryptographic transformation of information, simulative insertion for information integrity checking etc. However, the shortcomings of such methods are:

a lack of an information integrity processing method which in turn:

increases redundancy in the information being introduced for complex protection;

complicates processing and reduces the information exchange rate;

does not provide for the restoration of information integrity or the correction of natural errors in the data link; and does not provide protection against false information imposing in the method of direct code error-correction.

Further, there are well-known methods [3,4] for separating user access to information, based either on the use of password systems or information encryption to be stored on computer data storage media. Password-based systems provide insufficient protection as information will not be transformed in computer memory and a password check system can be overcome by advanced programmers. Protection based on information encryption in computer memory imposes heavy demands on information processing power when recording and reading information and consequently, it is applied rather seldom, their application is restricted due to relatively low transformation rates constraining information processing of the given application. For a wide application of data encoding, cryptoalgorithms with high processing rates and the large key space are required.

Also, there are method that control information integrity such as subscriber authentication and messages based on electronic digital signatures and public key systems [3] with authentication (or simulation-proof) codes. However, it is well known that such solutions are not "theoretical proof" as it was demonstrated that a dependence on reliability of information integrity protection systems, i.e. the probability of failure to detect substitutions from numbers of keys being used. The disadvantages of these methods are:

they are difficult and slow to implement, complicating their application in real time.

a lack of a method of precise estimation for the probability of information imposing ("fake" of signature) as length of escape sequence (key) is much shorter than length of the message being protected;

difficulties in the implementation of complex information protection on the basis of EDS facilities.

There are well-known effects involving information in information-telecommunication systems including those of an intentionally destructive nature:

attempts to link suppression due to the creation of intense artificial interference, which when applied to operations protecting against interferences cannot cope with;

attempts to destroy databases in information systems;

attempts to read from private information systems;

attempts to impose false information;

In the latest up-to-date international standards of telecommunication networks, a trend of using set functions that relate to information protection for operation as a part of a hardware-software system of a network can be overlooked include:

error protection in data links with noise combating codes;

authentication of messages and information integrity control (protection against information imposing);

randomization of signals;

protection against information review (cryptographic protection).

The IEEE 802.16 (WiMax) standard and the European standard EN 300 (DVB) can be mentioned as examples. Besides, various methods (algorithms, programs, devices) are used for separate protection tasks that in general further complicate the implementation of such systems, which causes difficulties when changing parameters for each of the methods, thereby decreasing the efficiency of the protection and increases the total amount of information redundancy.

The purpose of the instant invention is the universalization of the transmission and complex protection of information within one set of method operations, the extension of transmission capabilities by any data links, providing guaranteed parameters (probability-time characteristics of exchange) and to provide for a setup of general-purpose equipment for a wide set of types and quality of data links capable to be customized under conditions of application and achievable opportunities.

With a single introduction of redundancy, the proposed method makes it possible to realize all the above-mentioned information protection functions within one set of operations for information processing with higher performance.

According to the method, resolving of the following individual tasks is to be provided within the complex protection method presented in the instant invention, to which the following is referred:

protection against distortions in communication links (networks);

cryptographic protection against review;

cryptographic protection against false information imposing;

control and restoration of information integrity;

partition of user access to information;

protection against deliberately destructive effects on information in information systems.

To achieve these objectives in view, three concepts are to be used:

the application of random transformations bringing an element of randomness in the information processing and reducing the transmission process to use all possible signals or to group the codes and ciphers (a game approach involving minimizing the opponent's score);

the application of the principle and operations for decoding several copies of the code block to improve reliability in the delivery of information, thus ensuring high reliability in the information delivered;

the application of facilities for checking decision-making validity in the course of finding correctly accepted characters providing that, in the process of decoding any constructively specified decoding error probability is due to checking for precisely calculated outcomes of decoding.

To achieve the purpose of the invention, stochastic (n, k, q, m)-code (n-k-q-m-code) is used where n and k—are parameters representing of binary source code, q—is a code base, m—is the number of repetitions for code blocks with identical data portions (copy of code blocks) are reduced to the application of groups of code and ciphers providing reaching guaranteed validity when performing the selection of undistorted characters (localization), processing complications with exact calculations for probability outcomes, overlapping the whole range of channel quality in duplex and simplex modes for obtaining optimal results.

The task of more effective implementation is to be set for each protection type, as compared to known protection facilities but with new quality in providing guaranteed characteristics of information system such as guaranteed high validity with random character distortions (error probability in information released to the user is from $10^{-9}$ to $10^{-18}$ or less), guaranteed delivery of messages by any channel with nonzero capacity due to the use of the adaptation to channel properties described by the probability of distortion for a q-ary character and a guaranteed stability of protection etc.

According to the invention, the method of transmission and complex protection of information is proposed to be designed as follows.

The method of transmission and complex protection of information specified by the fact that prior to the beginning of an information transmission one should set the conditions of information exchange and the quality setting of the channel, then select the best values for parameters n, k and m for the stochastic q-ary (n, k, q, m)-code being used that is based on initial binary (n, k)-code (n-k-code) with l-interleaving ($q=2^l$), and transmission of m blocks of code with identical values for the data portion, then encode the information with the selected q-ary code, then perform direct randomization of the q-ary characters before transmitting to the channel, then perform reverse randomization of the q-ary characters on the receiving side, then control the integrity and authenticity of the q-ary characters and messages, then check the reliability of the integrity of said characters, then restore the integrity in the m-code blocks, then accumulate authentic q-ary characters to be released to the user after processing m-code blocks, then control the optimality and adjust the n, k and m parameters values.

Upon finishing these steps, the individual tasks of transmission and protection of information within one method are to be resolved as follows.

Information transmission is performed by all channels with nonzero capacity ensuring that the controllable properties of the information transfer protocol are set in advance.

Complex protection of information is realized as protection against distortions in communication links and networks and in information storages, by controlling authentication and information integrity restoration, wherein the controlling is performed by the separation of user access to the information, by cryptographic protection against review, by protection against false information imposing, by protection against willful destructive action onto information in information systems, and by ensuring information system performance.

Quality analysis of a data link or information storage medium being used is performed by means of transmission of a block of stochastic q-ary repetition code (n, 1, q) (n-l-q-code) and upon receiving one such block, performing a symbol-by-symbol matching of accepted q-ary characters and estimating the number of matched q-ary characters, then defining a proportion of the matched characters with respect to the length of the code n, by the value of the resulted quantity for the proportion of undistorted q-ary characters and select the code parameters along with restoring the integrity of the information transmission from the given channel.

The selection of optimal parameters for general-purpose duplex channels is made by the criterion of a maximum transmission rate with provisions for required validity to be defined in advance and estimated by error probability in the information released from a user.

The selection of optimal parameters for simplex channels are made by the criterion of provisions for required reliability in a message delivery estimated by the probability of message delivery from the first transmission with the assurance of required validity.

The randomization of q-ary characters upon transmission is performed to transform character values into random signals which are irrespective of the information being transmitted, on the receiving side—to transform the equiprobably error vector for a q-ary character into any one of q-l values for a q-ary character except for the transmitted q-ary character.

The randomization of q-ary characters is performed by using the operation twice described by the stochastic matrix of transitions involving a quasi-random randomization parameter obtained from a source, irrespective of the information being transmitted.

The constant initial values of the state for synchronous sensors of quasi-random numbers or cryptographic systems of private or public keys are used for the synchronization of processes for the generation of randomized parameters by transmitting and receiving portions.

The control of integrity for accepted q-ary bits of (n, k, q)-code (n-k-q-code) is realized using $N=2^{n-k}-1$ code test relations being strings in a test matrix of binary code H and their linear combinations, for a j-ary relation of the integrity control is carried out by modulo 2 summation of those of n q-ary characters to which character l corresponds in this j-ary test relation and by checking the value in the resulted sum, thus the relation is considered fulfilled and the q-ary characters are preliminarily recognized as complete or localized if this sum is equal to the combination from l zero binary characters, one estimates the number of localized $N_L$ characters ($N_L \subset [0, n]$), the number of realized relations $N_c$ ($N_c \subset [0, 2^{n-k}-1]$) and for each q-ary character with the number i—the number of the realized relations which include character, —$M_i$.

The validity check of the integrity for code blocks is performed by checking the conditions of $Nc=2^{r-t^*}-1$, $t^* \leq d-2$, where $t^*=n-N_L$, d—the code distance of the binary (n, k)-code (n-k-code).

The validity check of the integrity for individual q-ary characters is performed by checking the conditions $M_i(t^*) \geq \Pi_q(t^*)$, where $\Pi_q(t^*)$—the threshold values of realized relations numbers for q-ary characters with the defined value $t^*$, characters for which the conditions are not to be executed are deleted, and the $N_L$ value decreases by the number of deleted characters.

The restoration of information integrity is performed by the correction of non-local and deleted characters expressing the value of the corrected characters through values of authentically localized or previously corrected characters for which purpose one selects a test relation which includes one corrected character, other only authentically localized characters and previously corrected characters, wherein the value of the corrected character is estimated by a modulo 2 summation of the values for a valid localized and previously corrected characters as part of the selected test relation.

The decoding of m copies for (n, k, q)-code (n-k-q-code) is executed by the localization and accumulation of correctly accepted characters in three stages that estimate the total number of realized relations and the number of realized relations for each character, occurring simultaneously is the execution of steps creating matching pairs of m characters with the same name as found in the q-ary (m, 1, q)-block code (m-l-q-block code), further as these matched characters are locally accumulated, one performs localization of correctly accepted characters for all of the m blocks by following to the decoding rules for (n, k, q)-code, the characters localized in any block are accumulated, for previously non-local characters an intersection isolation technique is performed with the values of the non-local q-ary characters from different copies to be substituted in the checked test relation followed by a localization correctness check after the localization process was completed, finally unreliable and non-local characters are corrected by expressing their values through the values of authentically localized characters.

To control the optimality of the code being applied, one estimates the number of $N_{ot}$ blocks with integrity not restored by the applied code with the required validity on channel analysis interval of the length G for the last set of accepted blocks, then when the next block with non-restored integrity is encountered one calculates the proportion of such blocks as $\alpha = N_{OT}/G$, then checks for optimality conditions in the code being applied for in the form of the relation $\beta_{min} \leq \alpha \leq \beta_{max}$, in case of $\beta_{min} > \alpha$ solution for substitution of the operating code for less noise combating to be made, with $\alpha > \beta_{max}$–solution for replacement of the operating code for more noise combating.

The universalization for developing a method to be applied in any channels with nonzero capacity is to be achieved by the following steps.

The application of any duplex channels with nonzero capacity is achieved through a validity check of each block and by the adaptive selection of (n, k, q)-code being optimal for the current state of the channel with m=1.

The application of any simplex channels with nonzero capacity is achieved by a validity check of each code block and each q-ary character and by an m-fold transmission of code blocks with simultaneous decoding of m copies of code blocks with m defined as the desired probability of message delivery from the first transmission by the channel being applied using selected (n, k, q)-code and can be accomplished by a mfold technique during transmission by each of the $\chi$ bypass channels ($m=\chi\eta$).

Meanwhile, individual tasks for complex information protection are to be performed as follows.

Protection against distortions in communication channels and networks and in information storage is provided with direct code restoration of the integrity with validity guaranteed in arbitrary channels at a maximum possible rate in duplex channels of certain quality and with required reliability of message carrying in simplex channels. Upon that one restores information integrity within the correcting ability of the (n, k, q)-code, and detects errors with multiplicity that exceeds the correcting ability of the code, and re-transmits code blocks with uncorrected distortions, and performs adaptation according to the set criterion for optimality of parameters and that of the correcting ability of the code.

Control of authenticity and information integrity restoration is attained with the aid of authentication stochastic q-ary n-k-q-m-code with the randomization parameters obtained from the initial filling source being used as an authentication key.

To separate user access to the information when storing and transmitting a message from the particular user, randomization (stochastic transformation) of the message (a file) using a randomization parameter generated by the individual key of the appropriate user, is applied.

With cryptographic review protection, irrespective of the noise combating code being applied, randomization of the q-ary characters of the code is performed by a collection of ciphers to be replaced on each encryption unit with direct randomization (stochastic enciphering transformation) of the q-ary character provided irrespective of the transferred information, a quasi-random signal; reverse randomization (stochastic decoding transformation) of a the q-ary character executes reproduction of distortions in the q-ary character ensuring equal probability for each of the q-1 possible values of the character except for the one has been transmitted.

Protection against false information being imposed in the channel with designed interferences is performed by the (n, k, q)-code for integrity restoration under guaranteed probability of false information being imposed will not exceed the q-1 values. Code blocks with non-repaired distortions are re-transmitted by feedback signals.

With protection against deliberate destructive effects onto information systems in the form of intentional interferences in data links and against input of false destructive information in the system, a steady information exchange by adaptation to the channel state is provided including that with considerable quality loss in the channel.

Attainment of guaranteed characteristics for information systems under arbitrary functioning conditions is provided with the application of collections of codes and ciphers varying for each code block and q-ary character accordingly ensuring transmission signals to data link from all possible $2^n$ signals on a binary sequence of length n as a result of change in the strategy in the course of a fight against the source of destructive effects on the information system.

The most core properties of the method are performed as follows.

The guaranteed arbitrarily set probability of error decoding $P_{er}$ with decoding individual blocks (m=1) and m copies in the block of the (n, k, q, m)-code is provided by error correction to a specific multiplicity t not exceeding the value of dm−1−(log$_2$P$_{er}$)/l(t≦dm−1−(log$_2$P$_{er}$)/l), as when the error multiplicity exceeds this value, the information is not released to the user or it is released with instructions of its failure to meet the validity requirements.

One should provide several gradations with respect to validity with a unified code base q and the code distance of binary code d by filtering the decoded blocks on the receiving side, also with the number of errors corrected in the given block t=d−2, the probability of error decoding is equal to q$^{-1}$, wherein the number of errors corrected is t=d−3, thus the probability of error decoding is equal to q$^{-2}$, with the number of errors corrected t=d−4−q$^{-3}$ etc.

Guaranteed message carrying with the desired probability or real-time exchange is achieved by the transmission of m blocks with the identical data portion and by integrity restoration under a method of copy decoding, wherein that number of copies m is defined as depending on the desired probability of message carrying from the first transmission P$_{bri}$=P (≦t, N$_{mess}$), where t—number of corrected distorted q-ary characters through the length of the message N$_{mess}$ expressed is the number of q-ary characters.

The sequence of the method implementation is as follows.

Channel testing is made prior to information transfer by a data link in which properties are not known. Thus, a set of operations is performed equally for any channel with nonzero capacity. The testing sequence in the form of stochastic (n, l)-code (stochastic n-l-code) is transmitted in the channel where the value n is selected from the larger interval of adaptation (the relation between the worst and the best channel states), for example, n=100. Each of their n q-ary code characters in the process of transmission is exposed to direct and on the receiving side—to reverse randomization (stochastic transformation) which minimizes the probability of random matching for 2 or more distorted characters. Note that the testing procedure is considered completed successfully with n=100, and if 2 and more q-ary characters of 100 characters would have been found to be undistorted. Moreover, if the channel state is very low, one can also use code repetition for helpful information transmission which can provide message carrying (part of a message) with bit length l (one q-ary character) and with distortion n−2 for n characters of the code repetition. For providing a very good channel, for example with a probability of binary character distortion P$_0$=10$^{-5}$ (probability of the q-ary character distortion of the order of 10$^{-3}$), the code with the Hamming code parameters, an even parity check and with a code distance of d=4 and correcting t=2 from distorted q-ary characters would be the best channel, for example with parameters (512, 502) yields a code speed of 502/512=0.9804. Upon that, binary parameters of the code are equal (512l, 502l).

The information subject to protection is divided into q-ary characters of bit length l (q=2$^l$), aside from the length value of such characters is also selected proceeding from required reliability described by probability of error decoding P$_{er}$, besides, with q, relation P$_{er}$≦q$^{-1}$ takes place, for example value l=32 bits could be used to provide P$_{er}$=10$^{-9}$. It is important that according to the method, one is able to provide guaranteed validity in any arbitrary communication link to be structurally set in the designing process. So, P$_{er}$≦q$^{-1}$=10$^{-18}$ is provided with l=64 and so on.

For every k of q-ary characters, one forms n-k of redundant q-ary characters according to the rules of binary (n, k)-code, before the transmission to a data link, every q-ary character undergoes a randomization from the independent sensor involving a randomization parameter of ξ with a length no less than l, one performs reverse randomization (stochastic transformation) for every q-ary character involving synchronously generated values ξ with a length not less then l on the receiving side, localization is performed for correctly accepted q-ary characters, and estimates the number of the localized characters, checks the localization correctness, deletes invalidly localized characters, corrects non-local and deleted characters expressing values of the characters being corrected through values of authentically localized characters.

Thus, the creation of redundant characters is executed in turn for i q-ary characters (i ⊂ [1, n-k]) by modulo 2 summation of that q-ary character information in which character l corresponds to the test matrix H i-string of for binary (n, k)-code (n-k-code).

The combination of randomization parameters of bit length l is generated (before storing it in memory) for each q-ary character from information-independent sources on the transmitting side, then each q-ary character is exposed to randomization involving the randomization parameter, On the receiving side, after receipt from data link or after reading from memory, one generates a combination of randomization parameters of length l for each q-ary character synchronously with the transmitting side, performs a reverse randomization for each q-ary character involving the randomization parameter.

Then the integrity control of q-ary characters by the selection (localization) of correctly accepted characters is performed. To ensure validity guaranteed in the arbitrary channel, the principle of multiple error detection regarding characters of the code block is used when finding generality from undistorted characters being part of one of the test relations of the code, then such a relation is realized and undistorted characters being part of it are considered revealed or localized. Localization of correctly accepted q-ary characters is realized using N=2$^{n-k}$−1 code test relations being strings in the binary code H test matrix and their linear combinations, the check of correct receipt of q-ary characters for i-relation is performed by modulo 2 summation of those n q-ary characters to which character l corresponds in this j-ary test relation and by a value check of the resulted sum. The relation is considered executed and q-ary characters are recognized correctly accepted without distortions if this sum is equal to the combination from l zero binary characters, one calculates the number of localized N$_L$ characters (N$_L$ ⊂ [0, n]), the number of realized relations N$_c$ (N$_c$ ⊂ [0,2$^{n-k}$−1])]) and for each q-bit with number i-number of the realized relations which includes the character, —M$_i$.

Such a sequence of localization operations is featured by that when the number of distorted q-ary characters does not exceed a t=d−2 value, all correctly accepted characters whose number is n−d+2 or less, will be localized and they will be present no less than three realized test relations (with t=d−2—in three, with t=d−3—in seven etc.) that is a condition of possibility to check the correctness (fidelity) of character localization. Along with localization correction, each of the characters is included in an identical number of the realized relations. An error with probability not more than P$_{er}$≦q$^{-1}$ is possible with localization if after distortion of two and more q-ary characters there will be a situation when the differences for two (or more) q-ary characters from the transmitted values will be such that after a reverse stochastic transformation (designated as transformed of error vector e') that the sum modulo 2 will yield a sequence from l zero binary characters, then in spite of distortions of two or more characters, the test relation will be realized. However, the picture of localization results will essentially vary. First, the number of "localized" characters will be more than with an appropriate number of the realized relations; secondly, the number of realized relations $M_i$ where each i character has entered will be different for various characters. The procedure for a localization correctness check is to be built based on these features. Note that the code allows to correct the maximum number of $t=d-2$ with an error probability of $P_{er} \leq q^{-1}$, if $t=d-3$ errors have really occurred (by 1 less than a maximum possible), seven relations will be thus fulfilled and really attained validity of the block decoding is estimated by an error probability of $P_{er} \leq q^{-2}$, that is less by q times, etc.

Consequently, the validation of localization for block characters is performed by checking the conditions $Nc=2^{r-t^*}-1$, $t^* \leq d-2$, where $t^*=n-N_L$,-code distance for binary (n, k)-code for code blocks. Thus, the validation of localization for individual q-ary characters is performed by checking conditions $M_i(t^*) \geq \Pi_q$, where $\Pi_q$ ($t^*$)—threshold values of a number of the realized relations for q-ary character with the preset value of $t^*$, characters for which the condition is to be not executed, are erased, and $N_L$ value decreases by the number of erased characters.

The restoration of code block integrity for (or correction of the non-local and erased characters with required validity) is performed by expressing the value of the corrected character through values of authentically localized or previously corrected characters for which purpose one selects a test relation which includes one corrected character and other only authentically localized and previously corrected characters, the value of the corrected character is estimated by a modulo 2 summation of values for the localized and previously corrected characters being part of the selected test relation.

The optimality of the code applied in the digital channel code is controlled by controlling the maximum transmission rate.

The optimal code is available for each state of the duplex digital channel for which application maximizes the effective transmission rate in a data channel with feedback.

For channels of various quality (probability of distortion of binary $P_0$ character), the following collection of codes to maximize the transmission rate can be used, for example:
  with $P_0$ of the order of $10^{-1}$-code (8,2,q) or two-fold transmission (m=2) of the code (8,4,q) or code (16,7,q);
  with $P_0$ of the order of $10^{-2}$-code (8,4,q) or (16,7,q);
  with $P_0$ of the order of 10-code (16,11,q);
  with $P_0$ of the order of $10^{-4}$-code (32,26,q);
  with $P_0$ of the order of $10^{-5}$-code (128,120,q);
  with $P_0$ of the order of $10^{-6}$-code (256,247,q);
  $10^{-7}$-code (512,502,q).

Monitoring code optimality is based on the analysis of blocks in which decoding resulted in a failure to restore information integrity (failure to correct the errors completely due to excesses in error multiplicity of the code correcting ability). Formally, it is expressed in the form of a computation of a number of $N_{ot}$ blocks whose integrity was not restored by the code being applied with required validity of the last accepted blocks on the channel analysis interval of the length G, after the next block in which non-restored integrity, one calculates the proportion of such blocks as $\alpha = N_{OT}/G$. Then one checks the optimality conditions for the applied code in the form of the relation $\beta_{min} \leq \alpha \leq \beta_{max}$, in case $\beta_{min} \geq \alpha$, the decision on replacement of the operating code for less noise combating is made, with $\alpha \geq \beta_{max}$ decision on the replacement of the operating code for more noise combating is be taken. The lower and upper thresholds of optimality $\beta_{min}$ and $\beta_{max}$ to be selected during the designing process depends on the features of the transmission control protocol in the duplex channel and must have values of the order of 0.1 and 0.5.

Let's consider in more detail the order of support for several gradations on validity for constant code. Let BCH code (16,7) be used with a code distance of d=6 with a length of a q-ary character of l=32 bits.

If an error probability of $10^{-9}$ is sufficient for this operating method (when transmitting a given message), all blocks with corrected errors are delivered to the user and acknowledged by the reverse channel (with error multiplicity from 1 to 4), if the error probability required is less then $10^{-18}$, the blocks with a number of corrected errors of 1 to 3 will be delivered to the user and acknowledged, while blocks with a multiplicity of the corrected errors of 4 or more are not acknowledged by the reverse channel and will be re-transmitted in accordance with the data communications protocol being used. In addition, a block with 4 or more corrected errors will be stored for subsequent decoding in the method of copies processing along with re-transmitted value of the block. We have in mind in this case that all hardware and algorithmic solutions in a data transmission channel do not vary except for the customization of the filtering procedure of blocks on the decoder output when delivered to the user.

The prime operation of randomization (stochastic transformation) is performed at all stages of operation to provide the property for a q-ary symmetric channel, i.e. transformation of an error vector in a q-ary character into one of its possible values with equal probability. The application of such an operation provides guaranteed arbitrary channel reliability in the information delivered to the user.

Randomization can be performed by using a randomization parameter from a randomization generator with a constant initial filling to be set prior to the generator start-up as well as with the application of initial filling to be defined by a cryptographic key system (private or public).

The generation of randomization parameter values $\xi$ of the length l can be implemented by utilizing any known technical solution. The generator on the basis of a register with nonlinear functions in feedback loops based on tables with random filling (see Russian Federation patent No. 2246129) could be one of the implementation variants when the initial filling of tables with random numbers and shift register with feedback are key in cryptographic protection.

Randomization can be a cryptographic operation to provide:
  on the transmitting side, a transition to random signals in a data link when transmitting any information, even identical information in combinations of code blocks providing absolute privacy under the Shannon statement;
  on the receiving side—within each distorted q-ary character of bit length l its transformation into one of $2^l-1$ random combinations (except the transmitted one) with equal probability that provides receiving reliability of $P_{er} \leq q^{-1}$ is guaranteed in any arbitrary channel. Therefore, any required validity can be estimated (by selection of value l) including those that tend toward zero.

Protecting against false information being imposed under conditions of the simultaneously solved tasks of improving efficiency for the information transmission with any quality of the channel, and with considerable loss of this quality and protection against destructive effects as well, is solved due to operations of code integrity restoration (direct code error correction) with the guaranteed reliability of such successful restoration against any type of interference. That is, if the number of distorted q-ary characters does not exceed the correcting ability of the code, then these distortions will be authentically corrected, if the number of distorted characters exceeds the correcting ability of the code then there will be a reliable refusal of the correction and the distorted information will not be released as user information. If the number of such cases of error correction refusal is found to be more than that selected when defining an upper threshold, according to the procedure of adaptation, there will be a transition to use "stronger" code, thus having a lower code rate (relation R=k/n).

If the number of such cases of error correction refusal is found to be less than that selected when designing a defined lower threshold, according to the procedure of adaptation there will be a transition to use to "weaker" code, thus resulting in a higher code rate (relation R=k/n). The upper and lower thresholds of optimality to be selected in the process of designing, have values of the order of 0.5 and 0.1.

After a functional failure of the data transmission channel because of sharp deterioration of the channel quality and the impossibility to provide an exchange using previously selected code parameters, it is possible to continue the exchange from initial testing of the channel state with the repetition of code as described above.

The method of information transmission and protection being considered as analogs has a variety of technical solutions involving noiseless coding, services for authentication of messages and subscribers, services to provide stability in the functioning of information-telecommunication systems. The properties and features of the method are given below providing comparison of the method with other available analogs.

The technical tasks to be solved within the method break up to the following groups:

the wide application of the error-correction method in real data links (in the variant of integrity restoration);

protection complexity within one algorithm by introducing single redundancy;

by improving the interference resistance by lowering the channel quality;

the adaptability of function decisions in a data transmission channel within one protocol (equipment) with overlap over the whole range of channel quality;

by improving efficiency in data transmission (effective speed, real-time mode);

Let's consider the order and features of the method application under standard conditions for information-telecommunication systems.

Below are the following major variants of the instant method application under the conditions of use in:

general-purpose duplex channels,
simplex (unidirectional) channels,
real-time duplex channels,
channels of very poor quality,
data transmission channels to provide extremely high reliability,
information storage media (computer memory, databases, etc.),
session layer protocols to control and restore the integrity of messages.

The wide application of the error-correction method in real data links (integrity restoration) is achieved because of two main reasons:

the availability of an arbitrarily set upper bound on error probability after the decoding of any data link;

the rapid implementation of the codec due to binary characteristics of operations irrespective of the code base size.

The complexity of protection with the following features the single introduction of redundancy to solve all the problems requiring redundancy (error protection, protection against imposing, control and restoration of integrity in channels and databases, authenticity control)

the application of information units to be unified for all protection tasks (q-ary characters) is considered to be character noise combating code, as the encryption unit in the task of cryptographic protection against review;

the application of unified randomization operations (cryptographic transformation) for a solution of all tasks of cryptographic protection (protection against review, protection against false information imposing, authenticity control and control and integrity restoration).

Improving Noise-Stability, with the Deterioration of the Channel Quality as Well Message transmission by a duplex channel with a maximum rate and a required guaranteed reliability, preferably with several gradations (for all information—not worse $P_{req1}$, for the most important—not worse $P_{req2}$).

When solving the interference resistance problem three tasks arise following from different conditions of method application and proceeding from the method universality.

First, any preset validity must be attained in duplex channels of relatively high quality without lowering the effective (relative) transmission rate, which should not be significantly inferior to the capacity of the data link.

Second, to provide any preset reliability of message delivery by simplex channel (without feedback), it is necessary to have high interference resistance with keeping the required validity.

Third, such a method should not be constrain by the application of technically mastered high rates of information transmission that is to be quick-operating (and as simple in implementation as possible).

For message transmission by a simplex channel with provisions for the required validity in the message delivery with a set quality of the channel, it is proposed to use the m-fold transmissions of code blocks and the copies of the decoding method.

In simplex data links, the application of the method provides guaranteed validity with any arbitrarily set reliability of message delivery from first transmission including that in the poor quality channel where the copy decoding method can be used. Moreover, the copy decoding method provides the maximum possible correcting ability for construction of the expanded code. If the initial binary code has, for example, a code distance of d=4 (Hamming code with additional even parity check), the initial stochastic code (m=1) corrects two distorted q-ary characters and the expanded stochastic code with double repetition of the initial code (m=2) allows to correct the expanded six distorted q-ary characters (t=6), and when 10 characters are to be corrected with triple repetition of the block or no less than t=md−2 is corrected in the general case.

The real-time method becomes possible in duplex channels with the implementation of a method that includes the loss of channel quality, either by choosing a code with a large code distance in one block, or by transmission of 2 or more blocks at once (in the general case, of m identical code blocks) with their subsequent decoding by copy decoding algorithm when the number of corrected errors is md−2.

That is to say, the correcting ability being different from the code distance by a value of 2 is saved for (n, k, q, m)-code based on initial binary (n, k)-code with a code distance of d which has the same code distance of md.

The adaptability of function solutions for a data channel within one protocol (equipment) with overlap over the whole range of the channel quality owing to:

the availability of parameters set for initial code with which:

there is a possibility to define the level of authenticity and precisely set the quality of the channel being used;

there is a possibility to select the optimal code for any possible quality of the channel with probability of distortion for q-ary character from 0.5-0.6 to any small value of probability (respectively, from probability of distortion for binary character from 0.1 to any small value, for example, up to $10^{-7}$) as with any law of error stream distribution;

a unified description character for channel properties on which one can construct adapting operations, both at the start-up of a data transmission channel, and in the course of its operation:

at start-up—the application of repetition code, for example, with parameters (n, 1, q), when the presence of 2 or more distorted q-ary characters from n (for example, n=100) makes it possible to authentically and reliably define the initial quality of the channel;

after starting the operation, due to the estimation of number and portion (probability) of cases for the complete correction of distortions in the channel on the observation interval, one can conclude with assurance that the channel state has changed and the code being applied has to be substituted for "stronger" code (with higher correcting ability) or, on the contrary, for "weaker" code which at a higher code rate will provide a faster information transmission in the changed channel (with higher effective speed)

The improvement of efficiency in data transmission (effective speed, real-time mode) is attained by practical application of the method of code restoration for information integrity (direct error-correction with guaranteed validity).

Attainment of the specified properties of the method is provided due to application of game theory technique in systems of transmission or information processing by virtue of the application of "mixed strategies" and "randomized strategies", that is sets of exchangeable signal structures to provide the guarantee that the character of system characteristics that use groups of codes and ciphers, including;

the possibility of simple hardware and program implementation;

fast program and hardware implementation;

unified sets of information processing operations:

higher performance due to:

a single introduction of redundancy to solve all the problems requiring redundancy (error protection, protection against imposing, control and restoration of integrity in databases, authenticity control)

the application of information units to be unified for all tasks of protection (q-ary characters) considered as the character of noise combating code, as an encryption unit in the task of cryptographic protection against review;

the application of unified cryptographic transformation operations for the solution of all tasks of cryptographic protection (protection against review, protection against false information imposing, authenticity control and the control and restoration of integrity)

According to the invention, a transmission and integrated approach to information protection is provided by the following features and properties on the mathematical basis of the method:

the guaranteed character of properties of the method for the transmission and the protection of information;

the combination of code redundancy introduction and cryptographic transformation within the unified method of information protection;

the availability of parameters set for the initial code with which:

there is a possibility to define the authenticity and precise quality of the channel being used;

there is a possibility to select the optimal code for any possible quality of the channel with a probability of distortion for a q-ary character from 0.5-0.6 fpr any small value of this probability (respectively, from probability of distortion for binary character from 0.1 to any small value, for example, up to $10^{-7}$) for any law of error stream distribution;

the unified character of description of the channel properties on which one can construct adapting operations, both at a start-up data transmission channel, and in the course of its operation:

at start-up—the application of repetition code, for example, with parameters (n, 1, q), when the presence of 2 or more distorted q-ary characters from n (for example, n=100) makes it possible to authentically and reliably define the initial quality of the channel;

after starting the operation, due to the estimation of the number and the portion (probability) of cases of refusal for complete correction of distortions in the channel on the observation interval, one can conclude that with assurance that the channel state has changed and that the code being applied has to be substituted for "stronger" (with higher correcting ability) or "weaker" code which at a higher code speed will provide faster transmission of information in the changed channel (with higher effective speed);

the provision of application of a game theory technique in the system of transmission or information processing by virtue of the application of "mixed strategies", "randomized strategies", that is sets of exchangeable signal constructions to provide the guaranteed character of the system characteristics that is the use of groups of codes and ciphers;

the possibility of simple hardware and program implementation;

fast program and hardware implementation;

a unified set of information processing operations:

high performance due to:

single redundancy introduction to solve all the problems that require redundancy (error protection, protection against imposing, control and restoration of integrity in databases, authenticity control)

the application of information units to be unified for all protection tasks of q-ary characters is considered as a characteristic of noise combating code, as the encryption unit in the task of cryptographic protection against review;

the application of unified cryptographic transformation operations for the solution of all tasks of cryptographic protection (protection against review, protection against false information imposing, authenticity control, control and restoration of integrity)

The task of effective implementation for each of the types of protection is set upon the fact, that as compared to known protection frames but with a new provision quality for the guaranteed characteristics of information systems, such as a guaranteed high validity of arbitrary distortion characters (where the error probability of information produced for a user is between $10^{-9}$ and $10^{-18}$ and lower), and the guaranteed delivery of messages by any channel with nonzero capacity due to application of adaptation to properties of the channel described by the probability of distortion for q-ary characters, guaranteed stability protection etc.

The following is to be provided for the method implementation:

the combination of services for attaining various reliability requirements in one service (complex program) with simple customization of required reliability by the filter on the receiving side by filtering the reliability to the output of blocks with set numbers of the corrected characters;

the additional decreasing of decoding error probability is possible for the operating device with a particular length value of a q-ary character by additional insertion of new code with relatively larger and previously used code and the distance of initial binary code d, by entering the binary test matrix H of such code in memory of the device.

in all cases, one can achieve arbitrarily high reliability without changing the code redundancy. If the error probability can be obtained for a cyclic code by the introduction of redundant character numbers $\log_2 P_{er}$, in this case one can take the length of a q-ary character to be the minimum, and provide ultrahigh reliability by means of one—two codes with large code distance estimates with the aid of expression $P_{er}=2^{-(d-l-t)l}$, that is owing to the correction of lower than maximum possible t=d−2 number of distorted q-ary characters.

For example, by taking the length of a q-ary character of l=32 bits, one can provide the following set of properties, an error probability of no more than $10^{-9}$ is provided in the error detection method (one test q-ary character), in the method of copy decoding and error-correction on the maximum correcting ability (t=d−2), while decreasing the number of corrected characters by 1 (t=d−3, for example, for Hamming codes with an additional even parity check of d=4 due to the lowering of correcting ability in two up to one distorted q-ary character) and where the decoding error probability decreases to $10^{-18}$. To have an even higher rise in the level of validity (reduction of decoding error probability), one can use code with a large code distance, d, for example, by taking the BCH code (16, 7) with a code distance of d=6, one can achieve the following set of values for decoding error probability with l=32. With correction of 4, 3, 2, 1 distorted q-ary characters, the error probability after decoding will be $10^{-9}$, $10^{-18}$, $10^{-27}$ and $10^{-36}$ relatively.

Such a method of error-correction makes it possible to carry information by a channel of very low, and almost arbitrary quality with nonzero capacity. The capabilities of Stochastic code in the channel of arbitrarily poor quality can be illustrated by repetition code (n, 1) which allows successful delivery of a message by size in one q-ary character (1 bit) in case of distortion to n−2 q-ary characters. For example, if n=20, decoding takes place successfully with distortions from 1 to 18 for q-ary characters of length 20. The high validity of decision-making is thus provided in the process of decoding. For example, if the repetition code (20,1) shows that 10 characters are distorted in the process of decoding and the value which has matched 10 other characters is output as the correct character to the user, the error probability during decoding is equal to $q^{-9}$ in this case.

The above-mentioned method features the following advantages:

1) unification of transmission media and protection of information and hardware-software and software to realize them is provided;

2) arbitrarily small, almost zero decoding error probability is provided in the channel with arbitrary characters and the law of interference distribution;

3) the required maximum, close to 1, probability of message delivery from first transmission is provided in the error-correction method, including that in the decoding method for m copies of code blocks with poor quality of the channel;

4) a stable information exchange by the channel with unknown characteristics is provided; for an information exchange using this method, nonzero capacity of the given channel is sufficient, that is the presence of connectiveness or the possibility of information transmission;

5) the maximum for the given channel, an effective information transmission rate close to the capacity of the channel is provided;

6) due to application of the set of M stochastic codes with the restoration of information integrity (error-correction), the advantages following from properties of these codes are attained, that is to say:

the increase in efficiency of information processing with reaching:

guaranteed reliability in the error-correction mode with arbitrary character and intensity of distortions in data link the increase of the effective information transmission rate the provision of a real-time method where the high speed of information processing does not constrain the physical speed of a data link expressed in bits per second or during computer processing, for example during the encryption process while prior to media storing (decoding after reading-out from carriers);

the service for protection complexity within a unified set of information processing operations with single introduced redundancy, that is:

the protection against distortions in communication links (networks);

the cryptographic protection against review;

the cryptographic protection against false information imposing;

the control and restoration of information integrity;

the separation of user access to information;

the protection against deliberate destructive effects onto information in information systems.

services of high cryptographic stability at information protection owing to the following properties to be achieved:

after encryption and prior to quasi-random sequence of signals to be sent to data links, irrespective of statistics of separate characters in the source text;

the application of complex transformations which do not have any other formal description except for the description for the filling of random transformation tables;

the possibility to consider the initial filling of random tables as encryption key.

6) the wide application of noise combating code by the use of direct code error correction of channels along with the arbitrary law of distribution and intensity of errors in data links is provided including deliberate destructive distortions on communication channels, networks and other information systems.

For the fast and effective implementation of randomization (Stochastic transformation), it can be performed by operations based on random filling tables [5,6]. The generation of parameter transformation values ξ of a length l can be executed using a register with nonlinear functions in feedback loops based on random filling tables [7]. Meanwhile, with the implementation of the method and initial filling of tables with random numbers and feedback shift registers are the keys to cryptographic protection.

The method makes it possible to carry on information exchange by duplex and simplex channels under all possible conditions of transmission including those at which it is impossible to use any other method (poor quality of the channel, deliberate interferences), and provide calculation accuracy of these characteristics due to the randomization of signals and run all protection functions for information complexly with higher performance under all possible conditions within one algorithm of information processing with the introduction of single redundancy.

The method can be applied in all cases where noise combating code with error detection or correction is applied today: methods of cryptography, methods of protection against false information imposing, methods of separation of access to information in information systems, methods of protection against destructive effects, methods of control and restoration of information integrity in data arrays and in addition, in cases when both protection is complex (in tunneling protocols and special purpose systems) and in cases when separate tasks of complex protection were conventionally applied. That is to say, the method can be applied:

in networks like Internet/Inranet;
in networks using various stacks of protocols;
in radio networks and data links including those in wideband wireless networks like Wi-Fi, Wi-Max;
in broadcasting systems to provide interference resistance for transmission with the extension of range for signal reach and control of subscriber networks;
in operating systems and databases;
in networks of mobile telephony;
in applied software of information systems and control systems and so on.

List of References

1. Guideline CCITT X.25 and its application in information-computer networks. Description of the guideline X.25. International centre of scientific and technical information. Moscow, 1983.
2. W. Peterson, E. Weldon. The errors correcting codes. Mir, M, 1976.
3. Zima V. M., Moldovyan A. A., Moldovyan N. A. Safety of global network technologies.—SPb.; BHV-Petersburg, 2001.
4. Romanets J. V., Timofejev P. A, Shangin V. F. Information protection in computer systems and networks. —M: Radio and communication, 1999.
5. Patent of the Russian Federation No 2254685. Method of coding transformation of information. Author: Osmolovsky S. A., 2003.01.13.
6. Patent of Russia No. 2266622 "Method of block encryption of information. Author: Osmolovsky S. A. Application for a patent of the Russian Federation No 2004108916/09 (009857), priority 2004.03.29.
7. Patent of the Russian Federation No 2246129. Mode of generation of random numbers. Author: Osmolovsky S. A., 2003.01.13.

What is claimed is:

1. A method of protecting information during storage and transmission comprising:
   on a first computing device with a first processor and a first memory storage to a second computing device with a second processor, comprising:
   a step to set conditions to exchange information;
   a step to set channel quality;
   a step of selecting values for a first set of parameters, wherein said first set of parameters comprises a n parameter, a k parameter and a m parameter, for a stochastic q-ary-code, wherein said stochastic q-ary code comprises said first set of parameters and an initial binary (n, k)-code, wherein said initial binary code comprises a second set of parameters, wherein said second set of parameters comprises a second n parameter and a second k parameter and /-interleaving, wherein said/-interleaving comprises a q value of 2;
   a step of transmitting blocks of code with identical data portion values, wherein the number of blocks of code are equal to the value of said m parameter;
   a step of encoding the information with the stochastic q-ary code;
   a step of performing a direct randomization of said q-ary characters within said stochastic q-ary code before transmission to said channel;
   a step of performing reverse randomization of said q-ary characters on a receiving side of said transmission;
   a step of controlling a set of data properties of said q-ary characters, wherein said set of data properties comprises character and message data integrity and Character and message data authenticity;
   a step of checking the data validity of q-ary characters;
   a step of checking the data integrity of q-ary characters;
   a step of restoring the data integrity of said m parameter;
   a step of accumulating authentic q-ary characters;
   a step of releasing said authentic q-ary characters to a user after processing said m;
   a step of controlling data optimality; and
   a step of adjusting the values of said set of parameters n, k and m.

2. The method according to claim 1, wherein said method further comprises a step of transmitting said information by all channels comprising a nonzero capacity and a step of setting information transmission properties.

3. The method according to claim 1, wherein said method further comprises:
   a step to protect said information against distortions in communication channels;
   a step to protect said information against distortions in networks; and
   a step to protect said information against distortions in information storages devices;
   a step to control of authenticity of said information;
   a step to restore the integrity of said information;
   a step to prevent user access to said information;
   a step to provide cryptographic protection against unauthorized review of said information;
   a step to prevent transmission of false information;
   a step to prevent deliberate destructive effects on said information, wherein said information is found in information systems and services, wherein said information systems guarantee system information characteristics.

4. The method according to claim 1, wherein said method further comprises a step of transmitting at least one block of a stochastic q-ary repetition code, wherein said stochastic q-ary code comprises a first value n, a first value 1 and a first value q;
   a step of receiving at least one block of the stochastic q-ary repetition code, wherein said at least one block of stochastic q-ary repetition code comprises a second value n, a second value 1 and a second value;
   a step of performing a symbol-by-symbol matching of accepted q-ary characters
   a step of estimating a number of matching q-ary characters, wherein defining the proportion of matched characters is substantially that of the length of said first value n; and
   a step of selecting code integrity restoration parameters for information transmission within a given channel.

5. The method according to claim 1, wherein said method further comprises selecting a step to set a maximum transmission rate.

6. The method according to claim 1, wherein said method further comprises a step for selecting optimal parameters for simplex channels, wherein said optimal parameters for simplex channels is determined by weighing the required reliability for message delivery verse an estimated probability of message delivery from a first transmission, wherein said first transmission comprises a guarantee of required validity.

7. The method according to claim 1, wherein said method further comprises a step of randomizing q-ary characters of signals, wherein said randomization of q-ary characters of signals is performed in the transmission to transform character values into random signals irrespective of the information being transmitted.

8. The method according to claim 1, wherein said method further comprises: a step to use a $N=2^{n-k}-1$ algorithm to test code relations among strings within the test matrix of the binary code H and their linear combinations;
   a step to perform a modulo 2 summation of a set of q-ary characters, wherein one character comprised within said set of q-ary characters corresponds with a j-ary test relation and a check sum value, wherein a relation between said set of q-ary characters and said j-ary test relation is considered fulfilled when said set of q-ary characters is preliminarily recognized as complete and localized if said check sum value is equal to the combination of l zero binary characters;
   a step of estimating a number of localized $N_L$ characters ($N_L \subset [0, n]$), wherein a number of realized relations is $N_c$ ($N_c \subset [0, 2^{n-k}-1]$) and for each q-ary character comprising a length of i said number of realized relations further comprises an $M_i$ character.

9. The method according to claim 1 further comprises steps for a restoration of information integrity, wherein said steps for the restoration of information integrity comprises a step to correct non-local and deleted characters and expressing the value of a corrected character as values of authentically localized characters for which a user selects a test relation, wherein said test relation comprises a corrected character and an authentically localized and previously corrected character, wherein the value of the corrected character is estimated by a modulo 2 summation for values of valid localized and previously corrected characters being part of the selected test relation.

10. The method according to claim 1, wherein said method further comprises:
   a step for decoding m copies of n-k-q-code, wherein m is a number of n-k-q-code that requires decoding a step for accumulating and localizing correctly accepted characters, wherein an estimation of the total number of realized relations and a number of realized relations for each character are used;
   a step for executing paired matching of m characters comprising an equivalent name field for a block of q-ary m-1-q-code;
   a step for decoding of m copies of n-k-q-code, wherein matched characters are accumulated as localized characters, wherein one performs localization of correctly accepted characters for each of said m blocks according to the decoding rules of said n-k-q-code, wherein the characters localized in any block are accumulated, wherein for previously non-local characters one performs intersection isolation with values of non-local q-ary characters from different copies to be substituted in the checked test relation followed by a localization correctness check after localization and, wherein unreliable and non-local characters are corrected expressing their values through values of authentically localized characters.

11. The method according to claim 1 further comprising a step for controlling the optimality of code being applied, wherein an estimate of a number of blocks $N_{ot}$ with integrity not restored to said code being applied, wherein said code being applied requires a validity check on the channel analysis interval of length G for the last accepted blocks, wherein after a later block with non-restored integrity is encountered one calculates the proportion of such blocks as $\alpha=N/G$, wherein one checks the optimality conditions for said code being applied in the form of the relation $\beta_{min} \leq \alpha \leq \beta_{max}$, wherein in the case of $\beta_{min} \geq \alpha$ a decision for a substitution of an operating code for a less noise combating code is made, wherein in instances of $\alpha \geq \beta_{max}$ a substitution for higher noise combating code is made.

12. The method according to claim 7, wherein said method further comprises a step of randomizing q-ary characters by using the operation to be twice described by stochastic matrix of transitions involving quasi-random randomization parameter obtained from the source, irrespective of the information being transmitted.

13. The method according to claim 7, wherein said method further comprises a step of maintaining constant initial state values for synchronous sensors of quasi-random numbers and a step to use a cryptographic system of private and public keys for generating random parameters for transmitting and receiving information.

14. The method according to claim 8, further comprising the step of checking the conditions $Nc=2^{r-r'}-1$, $t^* \leq d-2$, wherein $t^*=n-N_L$, d–code distance of binary (n, k)-code.

15. The method according to claim 8 further comprising the step of checking threshold values of a realized number of relations of a q-ary character, wherein said q-ary character comprises a defined value t*, wherein any of said q-ary characters not comprising said defined value t* are not executed and are deleted, and wherein the $N_L$ value is decreased by the number of characters deleted.

* * * * *